United States Patent
Li et al.

(10) Patent No.: US 9,293,887 B2
(45) Date of Patent: Mar. 22, 2016

(54) CHIP-BASED LASER RESONATOR DEVICE FOR HIGHLY COHERENT LASER GENERATION

(75) Inventors: Jiang Li, Pasadena, CA (US); Hansuek Lee, Pasadena, CA (US); Tong Chen, Pasadena, CA (US); Kerry Vahala, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 545 days.

(21) Appl. No.: 13/525,147

(22) Filed: Jun. 15, 2012

(65) Prior Publication Data

US 2015/0092808 A1 Apr. 2, 2015

Related U.S. Application Data

(60) Provisional application No. 61/498,442, filed on Jun. 17, 2011.

(51) Int. Cl.
| | |
|---|---|
| *H01S 5/10* | (2006.01) |
| *H01S 3/30* | (2006.01) |
| *H01S 3/063* | (2006.01) |
| *H01S 3/083* | (2006.01) |
| *H01S 3/094* | (2006.01) |
| *H01S 3/0941* | (2006.01) |
| *H01S 3/17* | (2006.01) |

(52) U.S. Cl.
CPC ............... *H01S 3/30* (2013.01); *H01S 3/0632* (2013.01); *H01S 5/1075* (2013.01); *H01S 3/083* (2013.01); *H01S 3/0941* (2013.01); *H01S 3/094057* (2013.01); *H01S 3/176* (2013.01); *H01S 2301/02* (2013.01)

(58) Field of Classification Search
CPC ..... H01S 3/0604; H01S 5/1075; H01S 5/021; H01S 5/1042
See application file for complete search history.

(56) References Cited

U.S. PATENT DOCUMENTS

| | | |
|---|---|---|
| 4,461,672 A | 7/1984 | Musser |
| 4,938,841 A | 7/1990 | Shahar et al. |
| 5,872,022 A | 2/1999 | Motoda et al. |

(Continued)

OTHER PUBLICATIONS

Adar, R., et al., Less than 1 dB Per Meter Propagation Loss of Silica Waveguides Measured Using a Ring Resonator, J. Lightwave Tech. 1994, 12: 1369-1372.

(Continued)

*Primary Examiner* — Joshua King
(74) *Attorney, Agent, or Firm* — Steinfl & Bruno LLP

(57) ABSTRACT

A highly-coherent chip-based laser generating system includes a disk resonator incorporating a wedge structure fabricated from a silicon dioxide layer of a chip. The disk resonator is operable to generate a highly-coherent laser from a low-coherence optical pump input provided at an optical power level as low as 60 μW. The disk resonator is fabricated with sub-micron cavity size control that allows generation of a highly-coherent laser using a controllable Stimulated Brillouin Scattering process that includes matching of a cavity free-spectral-range to a Brillouin shift frequency in silica. While providing several advantages due to fabrication on a chip, the highly-coherent laser produced by the disk resonator may feature a Schawlow-Townes noise level as low as 0.06 $Hz^2$/Hz (measured with the coherent laser at a power level of about 400 μW) and a technical noise that is at least 30 dB lower than the low-coherence optical pump input.

16 Claims, 14 Drawing Sheets

(56) References Cited

U.S. PATENT DOCUMENTS

| | | | |
|---|---|---|---|
| 6,044,192 | A | 3/2000 | Grant et al. |
| 6,891,864 | B2* | 5/2005 | Vahala et al. ............... 372/3 |
| 6,895,133 | B1 | 5/2005 | Calkins et al. |
| 7,515,617 | B1* | 4/2009 | Vahala et al. ............... 372/21 |
| 7,590,326 | B2 | 9/2009 | Fincato et al. |
| 8,045,834 | B2 | 10/2011 | Painter et al. |
| 8,094,987 | B2 | 1/2012 | Martin Armani |
| 8,102,597 | B1 | 1/2012 | Maleki |
| 8,377,320 | B2 | 2/2013 | Wang et al. |
| 8,761,555 | B2 | 6/2014 | Matsko et al. |
| 8,818,146 | B2 | 8/2014 | Li et al. |
| 8,917,444 | B2 | 12/2014 | Li et al. |
| 2005/0111776 | A1* | 5/2005 | Martin et al. ............... 385/14 |
| 2005/0163185 | A1* | 7/2005 | Vahala et al. ............... 372/67 |
| 2005/0169331 | A1* | 8/2005 | Vahala et al. ............... 372/39 |
| 2007/0230856 | A1 | 10/2007 | Yamazaki |
| 2009/0285542 | A1* | 11/2009 | Armani et al. ............... 385/146 |

OTHER PUBLICATIONS

Aoki, T., et al., Observation of strong coupling between one atom and a monolithic microresonator, Nature 2006, 443: 671-674.

Armani, D.K., et al., Ultra-high-Q toroid microcavity on a chip, Nature 2003, 421: 925-928.

Barwicz, T., et al., Three-Dimensional Analysis of Scattering Losses Due to Sidewall Roughness in Microphotonic Waveguides, J. Lightwave Tech. 2005, 23: 2719-2732.

Bauters, J., et al. Ultra-low-loss high-aspect-ratio $Si_3N_4$ waveguides, Optics Express 2011, 19: 3163-3164.

Braje, D., et al., Brillouin-Enhanced Hyperparametric Generation of an Optical Frequency Comb in a Monolithic Highly Nonlinear Fiber Cavity Pumped by a cw Laser, Phys. Rev. Letters 2009, PRL 102: 193902-1-193902-4.

Cai, M., et al., Observation of Critical Coupling in a Fiber Taper to a Silica-Microsphere Whispering-Gallery Mode System, Phys. Rev. Letters 2000, 85: 74-77.

Carmon, T., et al., Dynamical thermal behavior and thermal self-stability of microcavities, Optics Express 2004, 12: 4742-4750.

Ciminelli, C., et al., Three-dimensional modeling of scattering loss in InGaAsP/InP and silica-on-silicon bent waveguides, J. Europ. Opt. Society 2009, 4: 09015-1-09015-6.

Ciminelli, C., et al., Photonic technologies for angular velocity sensing, Adv. Opt. & Photo. 2010, 2: 370-404.

Del'Haye, P., et al., Optical frequency comb generation from a monolithic microresonator, Nature 2007, 450: 1214-1218.

Del'Haye, P., et al., Full Stabilization of a Microresonator-Based Optical Frequency Comb, Phys. Rev. Letters 2008, PRL 101: 053903-1-053903-4.

Del'Haye, P., et al., Frequency comb assisted diode laser spectroscopy for measurement of microcavity dispersion, Nature Photonics 2009, 3: 529-533.

Del'Haye, P., et al., Octave Spanning Tunable Frequency Comb from a Microresontaor, Phys. Rev. Letters 2011, PRL 107: 063901-1-063901-4.

Ferdous, F., et al., Spectral line-by-line pulse shaping of on-chip microresonator frequency combs, Nature Photonics 2011, 5: 770-776.

Fortier, T.M., et al., Generation of ultrastable microwaves via optical frequency division, Nature Photonics 2011, 5: 425-429.

Foster, M., et al., Silicon-based monolithic optical frequency comb source, Optics Express 2011, 19: 14233-14239.

Gorodetsky, M., et al., Fundamental thermal fluctuations in microspheres, J. Opt. Soc. Am. B 2004, 21: 697-705.

Grudinin, I., et al., Ultrahigh optical Q factors of crystalline resonators in the linear regime, Phys. Rev. Letters A 2006, 74: 063806-1-063806-9.

Grudinin, I., et al., On the fundamental limits of Q factor of crystalline dielectric resonators, Optics Express 2007, 15: 3390-3395.

Grudinin, I., et al., Generation of optical frequency combs with a $CaF_2$ resonator, Optics Letters 2009, 34: 878-880.

Grudinin, I., et al., Brillouin Lasing with a $CaF_2$ Whispering Gallery Mode Resonator, Phys. Rev. Letters 2009, PRL 102: 043902-1-043902-4.

Hansch, T.W., et al., Laser Frequency Stabilization by Polarization Spectroscopy of a Reflecting Reference Cavity, Optics Comm. 1980, 35: 441-444.

Ip, E., et al., Coherrent detection in optical fiber systems, Optics Express 2008, 16: 753-821.

Illchenko, V.S., et al., Optical Resonators with Whispering-Gallery Modes—Part II: Applications, IEEE J Selected Topics in Quna. Elec. 2006, 12: 15-32.

Johnson, A., et al., Chip-based frequency combs with sub-100 GHz repetition, Optics Letters 2012, 37: 875-877.

Karlsson, C., et al., All-fiber multifunction continuous-wave coherent laser radar at 1.55 μm for range, speed, vibration, and wind measurements, Applied Optics 2000, 39: 3716-31726.

Kasai, K., et al., 256-QAM (64 Gb/s) Coherent Optical Transmission Over 160 km with an Optical Bandwidth of 5.4 GHz, IEEE Phon. Tech. Letters 2010, 22: 185-187.

Kippenberg, T.J., et al., Kerr-Nonlinearity Optical Parametric Oscillation in an Ultrahigh-$Q$ Toroid Microcavity, Phys. Rev. Letters 2004, 93: 083904-1-083904-4.

Kippenberg, T.J., et al., Demonstration of an erbium-doped microdisk laser on a silicon chip, Phys. Rev. A 2006, 74: 051802(R)-1-051802(R).

Kippenberg, T.J, et al., Cavity Opto-Mechanics, Optics Express 2007, 15: 17172-17205.

Kippenberg, T.J, et al., Microresonator-Based Optical Frequency Combs, Science 2011, 332: 555-559.

Kippenberg, T.J, et al., Cavity Optomechanics: Back-Action at Mesoscale, Science 2008, 321: 1172-1176.

Levy, J., et al., CMOS-compatible multiple-wavelength oscillator for on-chip optical interconnects, Nature Photonics 2009, 4: 37-40.

Lu., T., et al., High sensitivity nanoparticle detection using optical microcavities, PNAS 2011, 108: 5976-5979.

Lee, H., et al., Ultra-high-Q wedge-resonator on a silicon chip, arXiv: 1112.2196v1 2011, pp. 1-5.

Matsko, A., et al., Optical Resonators with Whispering Gallery-Gallery Modes—Part I: Basics, IEEE J Selected Topics in Quna. Elec. 2006, 12: 3-14.

Matsko, A., et al., Whispering-gallery-mode resonators as frequency references. I. Fundamental limitations, J. Opt. Soc. Am. B 2007, 24: 1324-1335.

Okawachi, Y., et al., Tunable All-Optical Delays via Brillouin Slow Light in an Optical Fiber, Phys. Rev. Letters 2005, PRL 94: 153902-1-153902-4.

Okawachi, Y., et al., Octave-spanning frequency comb generation in a silicon nitride chip, Optics Letters 2011, 36: 3398-3400.

Okai, M., et a., Strained multiquantum-well corrugation-pitch-modulated distributed feedback laser with ultranarrow (3.6 kHz) spectral linewidth, Elec. Letters 1993, 29: 1696-+.

Pant, R., et al., Cavity enhanced stimulated Briollouin scattering in an optical chip for multiorder Stokes generation, Optics Letters 2011, 36: 3687-3689.

Payne, S., et al., A theoretical analysis of scattering loss from planar optical waveguides, Opt. and Quan. Elec. 1994, 26: 977-986.

Quinlan, F., et al., A 12.5 GHz-spaced optical frequency comb spanning >400 nm for near-infrared astronomical spectrograph calibration, Rev. Sci. Instr. 2010, 81: 063105-1-063105-9.

Rafac, R.J., et al., Sub-dekahertz Ultraviolet Spectroscopy of $^{199}$Hg+, Phys. Rev. Letters 2000, 85: 2462-2465.

Razzari, L., et al., CMOS-compatible integrated optical hyper-parametric oscillator, Nat. Phon. 2009, 4: 41-45.

Savchenkov, A., et al., Low Threshold Optical Oscillations in a Whispering Gallery Mode $CaF_2$ Resonator, Phys. Rev. Letters 2004, PRL 93: 243905-1-243905-4.

Savchenkov, A., et al., Whispering-gallery-mode resonators as frequency references. II. Stabilization, J. Opt. Soc. Am. B 2007, 24: 2988-2997.

Savchenkov, A., et al., Optical resonators with ten million finesse, Optics Express 2007, 15: 6768-6773.

Savory, S., et al., Laser Linewidth Requirements for Optical DQPSK Systems, IEEE Photo. Tech. Letters 2004, 16: 930-932.

(56) References Cited

OTHER PUBLICATIONS

Schawlow, A.L., et al., Infrared and Optical Masers, Phys. Rev. 1958, 112: 1940-1949.

Schliesser, A., et al., Resolved-sideband cooling of a micromechanical oscillator, Nature Physics 2008, 4: 415-419.

Shi, J.W., et al., High-Speed, High-Responsivity, and High-Power Performance of Near-Ballistic Uni-Traveling-Carrier Photodiode at 1.55 μm Wavelength, IEEE Photo. Tech. Letters 2005, 17: 1929-1931.

Smith, S.P., et al., Narrow-linewidth stimulated Brillouin fiber laser and applications, Optics Letters 1991, 16: 393-395.

Spillane, S.M., et al., Ultralow-threshold Raman laser using a spherical dielectric microcavity, Nature 2002, 415: 621-623.

Spillane, S.M., et al., Ideality in a Fiber-Taper-Coupled Microresonator System for Application to Cavity Quantum Electrodynamics, Phys. Rev. Letters 2003, 91: 043902-1-043902-4.

Tien, M.C., et al., Ultra-high quality factor planar Si3N4 ring resonators on Si substrates, Optics Express 2011, 19: 13551-13556.

Tomes, M., et al., Photonic Micro-Electromechanical Systems Vibrating at X-band (11-GHz) Rates, Phys. Rev. Letters 2009, PRL 102: 113601-1-113601-4.

Yang, L., et al., A 4-Hz Fundamental Linewidth on-chip Microlaser, CLEO 2007, pp. 1-2.

Udem, Th., et al., Optical frequency metrology, Nature 2002, 416: 233-237.

Vahala, K., et al., Semiclassical Theory of Noise in Semiconductor Lasers—Part I, IEEE J Quan. Elec. 1983, QE-19: 1096-1101.

Vahala, K., Optical microcavities, Nature 2003, 424: 839-846.

Veroony, D.W., et al., High-$Q$ measurements of fused-silica microspheres in the near infrared, Optics Express 1998, 23: 247-249.

Vollmer, F., et al., Whispering-gallery-mode biosensing: label-free detection down to single molecules, Nature Methods 2008, 5: 591-596.

Young, B.C., et al., Visible Lasers with Subhertz Linewidths, Phys. Rev. Letters 1999, 82: 3799-3802.

Zhu, Z., et al., Stored Light in an Optical Fiber via Stimulated Brillouin Scattering, Science 2007, 318: 1748-1750.

Zhu, Z., et al., Broadband SBS Slow Light in an Optical Fiber, J. Lightwave Tech. 2007, 25: 201-206.

Tkach, RW, et al., Spontaneous Brillouin Scattering for Single-Mode Optical-Fibre Characterisation, Elec. Letters 1986, 22: 1011-1013.

Li, J., et al., Chip-based Brillouin lasers as spectral purifiers for photonic systems, arXiv:1201.4212 2011, pp. 1-5.

Li, J., et al., Highly Coherent, Microcavity Brillouin Laser on Silicon, FIO/LS Tech. Digest 2011, pp. 1-2.

Anetsberger, G., et al., Ultralow-dissipation optomechanical resonators on a chip, Nature Photonics 2008, 2: 627-633.

Lu, T., et al., Frequency Noise of a Microchip Raman Laser, CLEO 2009, pp. 1-2.

Savchenkov, A., et al., Tunable Optical Frequency Comb with a Crystalline Whispering Gallery Mode Resonator, Phys. Rev. Letters 2008, PRL 101: 093902-1-093902-4.

Kominato, Extremely Low-loss (0.3 dB/m) and Long Silica-Based Waveguides with Large Widtth and Clothoid Curve Connection, ECOC Proceedings 2004, 2: pp. 1-2.

Li, J., et al., Characterization of a high coherence, Brillouin microcavity laser on silicon, Optics Express 2012, 20: pp. 1-11.

Li, J., et al., Low-Pump-Power, Low-Phase-Noise, and Microwave to Millimeter-Wave Repetition Rate Operation in Microcombs, Physical Review Letters 2012, 109: 233901-1-233901-5.

Lee, H., et al., Chemically etched ultrahigh-Q wedge-resonator on a silicon chip, Nature Photonics 2012, 6: 369-373.

Notice of Allowance mailed on Jun. 16, 2014 for U.S. Appl. No. 13/494,707, filed Jun. 12, 2012 in the name of Kerry Vahala et al.

Kippenberg, T.J. et al. "Fabrication and coupling to planar high-Q silica disk microcavities," Applied Physics Letters, vol. 83(4), pp. 797-799, 2003.

Xu, D.X. et al. "Archimedean spiral cavity ring resonators in silicon as ultra-compact optical comb filters" Optics Express, vol. 18, No. 3, pp. 1937-1945, 2010.

Restriction Requirement mailed on Dec. 29, 2010 for U.S. Appl. No. 12/436,935, filed May 7, 2009 in the name of Andrea Martin Armani et al.

Non-Final Office Action mailed on May 3, 2011 for U.S. Appl. No. 12/436,935, filed May 7, 2009 in the name of Andrea Martin Armani et al.

Notice of Allowance mailed on Jul. 26, 2011 for U.S. Appl. No. 12/436,935, filed May 7, 2009 in the name of Andrea Martin Armani et al.

Gorodetsky, M.L., et al. "Ultimate Q of optical microsphere resonators." Optics Letters, vol. 21, No. 7, pp. 453-455, 1996.

Lytollis J., et al. "Infra-red optical communication systems." Infrared Physics, vol. 8, Issue 1, pp. 123-129; 1968.

Hossein-Zadeh, M. and Vahala, K.J. "Importance of Intrinsic-Q in Microring-Based Optical Filters and Dispersion-Compensation Devices." Photonics Technology Letters, vol. 19, Issue 14, pp. 1045-1047, 2007.

Kohtoku, M., et al. "New Waveguide Fabrication Techniques for Next-generation PLCs." NTT Technical Review, vol. 3, No. 7, pp. 37-41, 2005.

Syms, R.R.A. et al., "Reflow and Burial of Channel Waveguides Formed in Sol-Gel Glass on Si Substrates." IEEE Photonics Technology Letters, vol. 5, No. 9, 1077-1079, Sep. 1993.

Poulsen, M.R. et al., "Advances in silica-based integrated optics." Opt. Eng., vol. 42, 2821-2834, Oct. 2003.

Non-Final Office Action mailed on Sep. 1, 2011 for U.S. Appl. No. 13/033,391, filed Feb. 23, 2011 in the name of Andrea Martin Armani et al.

Non-Final Office Action mailed on Nov. 25, 2011 for U.S. Appl. No. 13/033,391, filed Feb. 23, 2011 in the name of Andrea Martin Armani et al.

Restriction Requirement mailed on May 31, 2014 for U.S. Appl. No. 13/525,189, filed Jun. 15, 2012 in the name of Jiang Li et al.

Ex Parte Quayle Action mailed on Jul. 7, 2014 for U.S. Appl. No. 13/525,189, filed Jun. 15, 2012 in the name of Jiang Li et al.

Geng, J. et al. "Narrow Linewidth Fiber Laser for 100-km Optical Frequency Domain Reflectometry," IEEE Photon. Technol. Lett. 17, 1827-1929, 2005.

Li, J. et al. "Chip-Based Frequency Combs with Microwave Repetition Rate." 6 pgs Mar. 28, 2012.

Lee, H. et al. "Ultra-Low-Loss Optical Delay Line on a Silicon Chip." 7 pgs. Mar. 20, 2012.

Notice of Allowance mailed on Sep. 8, 2014 for U.S. Appl. No. 13/525,189, filed Jun. 15, 2012 in the name of Jiang Li et al.

Agrawal, G.P. "Mode-partition noise intensity correlation is a two-mode semiconductor laser" *Physical Review A* vol. 37, No. 7 (1988) pp. 2488-2494.

Papp, S.B. et al. "Spectral and temporal characterization of a fused-quartz-microresonator optical frequency comb" *Physical Review A*, vol. 84, pp. 053833-1-053833-7 (2011).

Notice of Allowance mailed on Jan. 30, 2015 for U.S. Appl. No. 14/513,058, filed Oct. 13, 2014 in the name of California Institute of Technology.

\* cited by examiner

CHIP-BASED LASER RESONATOR DEVICE FOR HIGHLY COHERENT LASER GENERATION

CROSS REFERENCE TO RELATED APPLICATIONS

The present application claims priority to U.S. Provisional Patent Application No. 61/498,442 entitled "Highly Coherent, Microcavity Brillouin Laser on Silicon" filed on Jun. 17, 2011 which is incorporated herein by reference in its entirety. The present application may also be related to: i) U.S. Provisional Patent Application No. 61/498,444 entitled "Chip-Base Frequency Comb with Microwave Repetition Rate" filed on Jun. 17, 2011, ii) U.S. Provisional Patent Application No. 61/496,440 entitled "Ultra Low Loss Wedge Waveguide and Resonator on a Chip" filed on Jun. 13, 2011, iii) U.S. Pat. No. 8,045,834, and iv) U.S. Utility patent application Ser. No. 13/494,707 entitled "Silica-on-Silicon Waveguides and Related Fabrication Methods" filed on Jun. 12, 2012, all of which are also incorporated herein by reference in their entirety.

STATEMENT OF GOVERNMENT GRANT

This invention was made with government support under FA9550-10-1-0284 awarded by the United States Air Force. The government has certain rights in the invention.

FIELD

The present teachings relate to lasers. In particular, the present teachings relate to semiconductor laser resonator devices fabricated in integrated circuits (ICs).

DESCRIPTION OF RELATED ART

Laser devices that generate high coherence lasers are used in a wide range of applications. Typically, laser devices having large cavities are used for obtaining desired levels of coherence because larger cavities (in other words, larger energy storage capacity) directly reduce quantum phase noise and also render the generated laser frequency less sensitive to cavity vibration. However, this basic scaling rule of larger size is at odds with emerging trends that place focus on reducing the size of high coherence light sources in order to provide easier interaction or coupling with a variety of elements such as integrated circuits, tapered optical fibers, and miniature couplers. Unfortunately, such size reduction is often achieved at the expense of coherence, because quantum and technical noise contributions to laser coherence increase as laser-cavity form factor is decreased.

In the context of such efforts, while stimulated Brillouin scattering is a well-known effect, its application in microcavities for laser sources has only recently been documented in bulk-type $CaF_2$ cavities and microsphere cavities [15, 16]. The principal challenge is to create sufficiently high-Q devices with the requisite mode spacing so as to precisely frequency match the narrow-band Brillouin gain spectrum. Specifically, the narrow linewidth of the Brillouin gain requires better than 1:1000 control of the resonator diameter to obtain a match and more realistically it requires 1:10,000 control for consistent low-threshold turn-on power. So far, the process of manufacturing resonator devices in larger volumes has relied on statistical procedures involving variation in size and shape to create accidental matches using different order of transverse modes among devices.

Generally, as part of this matching process, current manufacturing processes involve producing a batch of laser devices, say by using semiconductor manufacturing techniques, and then testing each of the devices in the batch of devices to identify a few devices that have an acceptable level of variance in performance characteristics between the devices. This process includes accepting a certain level of coherence that is a compromise value in comparison to large cavity devices.

Consequently, it is desirable to fabricate miniature laser devices that do not significantly sacrifice coherence for the sake of compactness. It is further desirable to provide such devices in the form of silicon-based integrated circuits with better manufacturing yield.

SUMMARY

According to a first aspect of the present disclosure, a highly coherent chip-based laser generating system is provided. The system includes a disk resonator that incorporates a wedge structure fabricated from a silicon dioxide layer of a chip. The disk resonator is operable to generate a highly-coherent laser from a low-coherence optical pump input provided at an optical power level as low as 60 microwatts.

According to a second aspect of the present disclosure, a highly coherent laser generating system is provided. The system includes a disk resonator fabricated from a silicon substrate with a sub-micron cavity size control, the disk resonator operable to generate a highly-coherent laser using stimulated Brillouin scattering on a chip, the highly-coherent laser characterized in part, by a Schawlow-Townes noise level as low as 0.06 $Hz^2/Hz$ at a power level of about 400 µW.

According to a third aspect of the present disclosure, a method of manufacturing laser devices for one or more coherent laser generating systems, the method includes fabricating a batch of disk resonators from a silicon substrate, the fabricating comprising precision control of a diameter dimension to obtain a substantial similar Q factor in each disk resonator.

Further aspects of the disclosure are shown in the specification, drawings and claims of the present application.

BRIEF DESCRIPTION OF THE DRAWINGS

Many aspects of the present disclosure can be better understood with reference to the following drawings. The components in the drawings are not necessarily drawn to scale. Instead, emphasis is placed upon clearly illustrating various principles. Moreover, in the drawings, like reference numerals designate corresponding parts throughout the several views.

DETAILED DESCRIPTION

Figure 11:
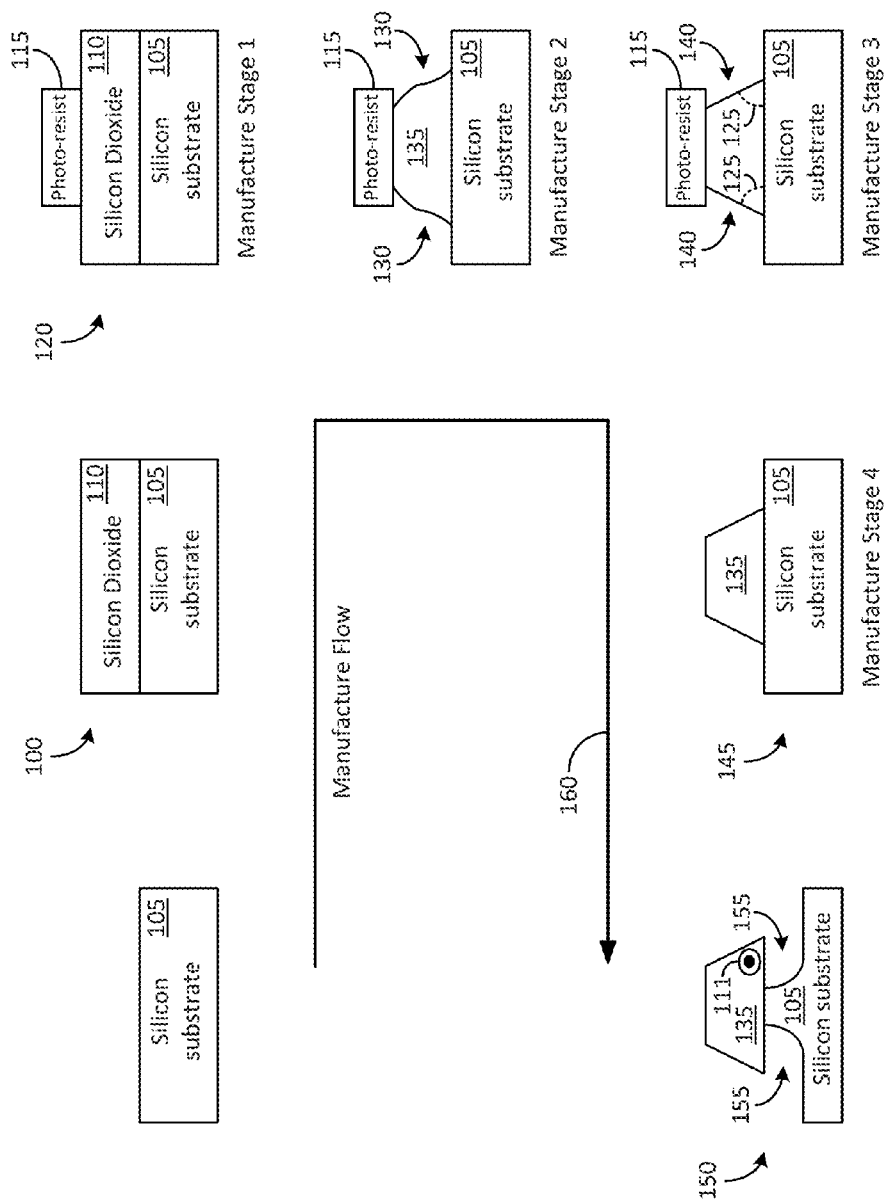
FIG. 11 shows a manufacture flow of a disk resonator in accordance with one embodiment of the invention.

Throughout this description, embodiments and variations are described for the purpose of illustrating uses and implementations of the inventive concept. The illustrative description should be understood as presenting examples of the inventive concept, rather than as limiting the scope of the concept as disclosed herein. For example, it will be understood that terminology such as, for example, optical, photonic, silica, silicon and chip are used herein as a matter of convenience for description purposes and should not be interpreted literally in a narrowing sense. Furthermore, a disk resonator may be alternatively referred to herein as a wedge, resonator, a circular wedge resonator, a waveguide resonator, a simulated Brillouin laser (SBL) device, a laser resonator device or other such terms; optical propagation may be alternatively referred to herein as photonic propagation or light propagation; a light source may be indicated as providing a laser; and input light power may be referred to as input optical power. A person of ordinary skill in the art will understand that these terms may be used interchangeably and as such must be interpreted accordingly. It will be also be understood that the drawings use certain symbols and interconnections that must be interpreted broadly as can be normally understood by persons of ordinary skill in the art. As one example, of such interpretation, the sloping surface on manufacturing stage 2 in FIG. 11, is shown to have a certain non-linear profile. However, one of ordinary skill in the art will understand that the sloping surface may have protrusions and/or indentations in various other shapes. Furthermore, the region referred to herein as a "foot region" does not necessarily imply a close resemblance to a foot, but is more generally intended to indicate a surface area that is not smooth and harmonious. As can be understood by one of ordinary skill in the art, such rough surfaces negatively impact light propagation (via scattering, reflection, absorption, dissipation etc).

Figure 1:
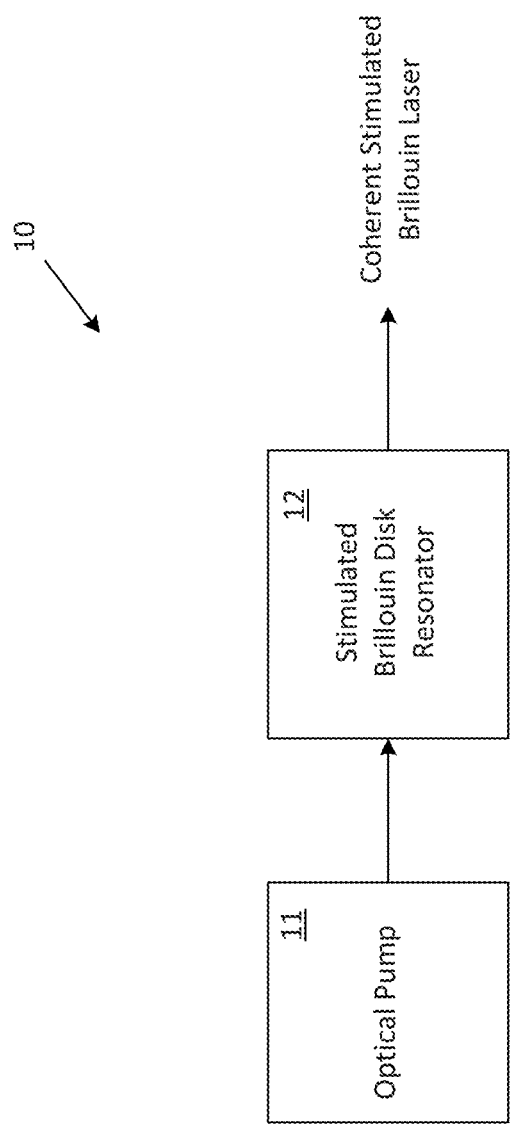
FIG. 1 shows a first exemplary coherent laser generating system that includes a laser resonator device, in accordance with the invention.

Attention is now drawn to FIG. 1, which shows a first exemplary coherent laser generating system 10 that includes an optical pump 11 coupled via a fiber taper to a simulated Brillouin laser (SBL) disk resonator 12 that is fabricated on a chip in accordance with the invention.

A high coherence laser is generated in accordance with the invention by a SBS process implemented in an ultra-high-Q disk resonator on a chip. By designing and fabricating the cavity size such that the cavity free-spectral-range matches the Brillouin shift frequency in silica, the Brillouin lasering process features maximum gain parameter and thus low threshold (as low as 60 microwatts), and high efficiency (90% overall efficiency and 95% differential efficiency) as described below in various exemplary embodiments. This approach makes SBL in microcavities a controllable and highly efficient process, in contrast to the statistical and uncontrollable approaches reported in [15, 16].

Optical pump 11 may be implemented using a variety of light sources. In various embodiments, optical pump 11 is typically implemented using a low-coherence continuous wave (CW) laser, for example, an external cavity diode laser. Simulated Brillouin laser (SBL) disk resonator 12 is designed and fabricated such that its free-spectral-range (FSR) matches the Brillouin shift in silica. Therefore, both the pump and the stimulated Brillouin stokes are guaranteed to be both in resonance within the disk cavity and thus the Brillouin stokes laser can oscillate above pump threshold. The stimulated Brillouin laser (SBL) on a chip features high coherence, and is characterized, at least in part, by very low Schawlow-Townes noise (ST) noise $S_\nu$. In one exemplary embodiment, the ST noise, $S_\nu$, is less than 0.06 Hz$^2$/Hz measured at an output power of approximately 400 µW. The Schawlow-Townes noise recorded in accordance with the invention (0.06 Hz$^2$/Hz) may be the lowest fundamental noise of any-chip based laser. The ST noise, $S_\nu$, relates to the fundamental full-width-half-maximum linewidth $\Delta\nu$ of the Lorentzian laser spectrum as: $\Delta\nu = 2\pi \cdot S_\nu$. Thus the fundamental laser linewidth of the SBL is 0.38 Hz. In comparison, state-of-the-art, high-coherence, monolithic semiconductor lasers feature a fundamental linewidth of 3 kHz [14] by using a long-cavity, corrugation-pitch-modulated laser structure.

Furthermore, the low-frequency technical noise generated in simulated Brillouin laser (SBL) disk resonator 12 is advantageously comparable to commercial fiber lasers. Such a performance in a chip-based device is attributable to a ultra-high-Q cavity [9, 10] that enables precise matching of the Brillouin gain shift to the free-spectral-range (FSR), thereby guaranteeing reliable oscillation. Specifically, simulated Brillouin laser (SBL) disk resonator 12 features more than 90% conversion of lower-coherence pump input (provided by optical pump 11) to high-coherence laser output, at threshold powers as low as 60 µW.

Elaborating upon the subject of noise, it may be pertinent to point out that frequency noise in laser sources has two general contributions: one associated with technical noise such as thermal drift and microphononics; and a second of fundamental origin, the Schawlow-Townes noise from spontaneous emission. Driven by the need for better frequency stability in applications like LADAR and optical communications [30-32], there has been increasing interest in laser sources that achieve stability more typical of fiber lasers, but in a compact footprint. Reduction of laser cavity size, however, typically works against this objective as the Schawlow-Townes linewidth scales inverse-quadratically with cavity Q factor at a given output power. This frequency-noise scaling feature of lasers is, in fact, responsible for the dominant role of Schawlow-Townes noise in telecommunications semiconductor lasers [12].

As described below in more detail, simulated Brillouin laser (SBL) disk resonator 12 is fabricated in a silicon-based integrated circuit (IC) thereby providing various benefits including size reduction, high yield, cost reduction, and ease of integration with various optical elements such as optical fibers and optical waveguides. In accordance with the invention, the manufacture of laser resonator device 12 involves techniques that provide not only a sub-micron level of precision in fabricating a diameter dimension of a circular resonator disk, but further result in the circular disk resonator providing Q factors as high as 875 million. The sub-micron precision in fabrication of the diameter, implemented for example, as a resonator size control to 0.3 micron, enables a precise frequency match to a desired Brillouin performance characteristic.

Figure 2:
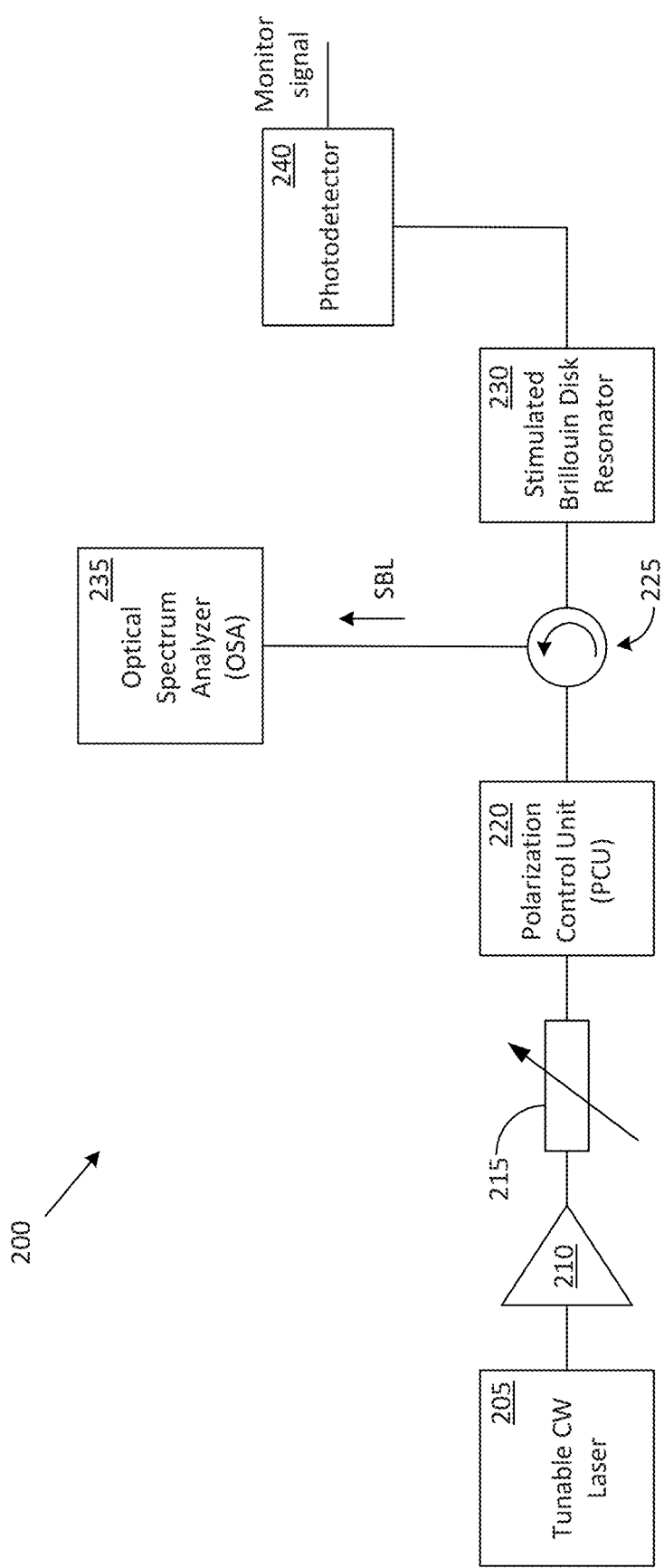
FIG. 2 shows a second exemplary coherent laser generating system that includes a laser resonator device, in accordance with the invention.

Attention is now drawn to FIG. 2, which shows a second exemplary coherent laser generating system 200 that includes a simulated Brillouin laser (SBL) disk resonator 12 in accordance with the invention. Laser resonator device 12 is pumped to resonance by tunable CW laser 205 that provides light input to simulated Brillouin laser (SBL) disk resonator 12 via an erbium doped fiber amplifier (EDFA) 210, a variable attenuator 215, a polarization control unit 220, and a circulator 225. A taper-fiber technique is used to couple the light into simulated Brillouin laser (SBL) disk resonator 12. Simulated Brillouin laser (SBL) light propagating out of simulated Brillouin laser (SBL) disk resonator 12 in a backwards direction is coupled via circulator 225 for measurement of certain characteristics in instruments such as optical spectrum analyzer 235, an interferometer (not shown) or a photo diode (not shown). The output of simulated Brillouin laser (SBL) disk resonator 12 is provided to photodetector 240 which generates a monitor signal in the electrical domain. The output of photodetector 240 may also be provided to suitable circuitry (not shown) for generating an error signal that is used for locking tunable CW laser 205.

By proper control of taper loading, the simulated Brillouin laser (SBL) may be operated in two distinct ways: cascade or single-line. In the cascade mode of operation, the loading of a waveguide in simulated Brillouin laser (SBL) disk resonator 12 is kept low so that once oscillation on the first Stokes line occurs, this action can function as a pump wave for a second Brillouin wave and so on. In contrast to the cascade mode of operation, in the single-line mode of operation the waveguide loading is set to a value that critically couples the pump wave at the target laser output power. This operational mode advantageously suppresses oscillation on all modes leading to high side-mode suppression.

Figure 3:
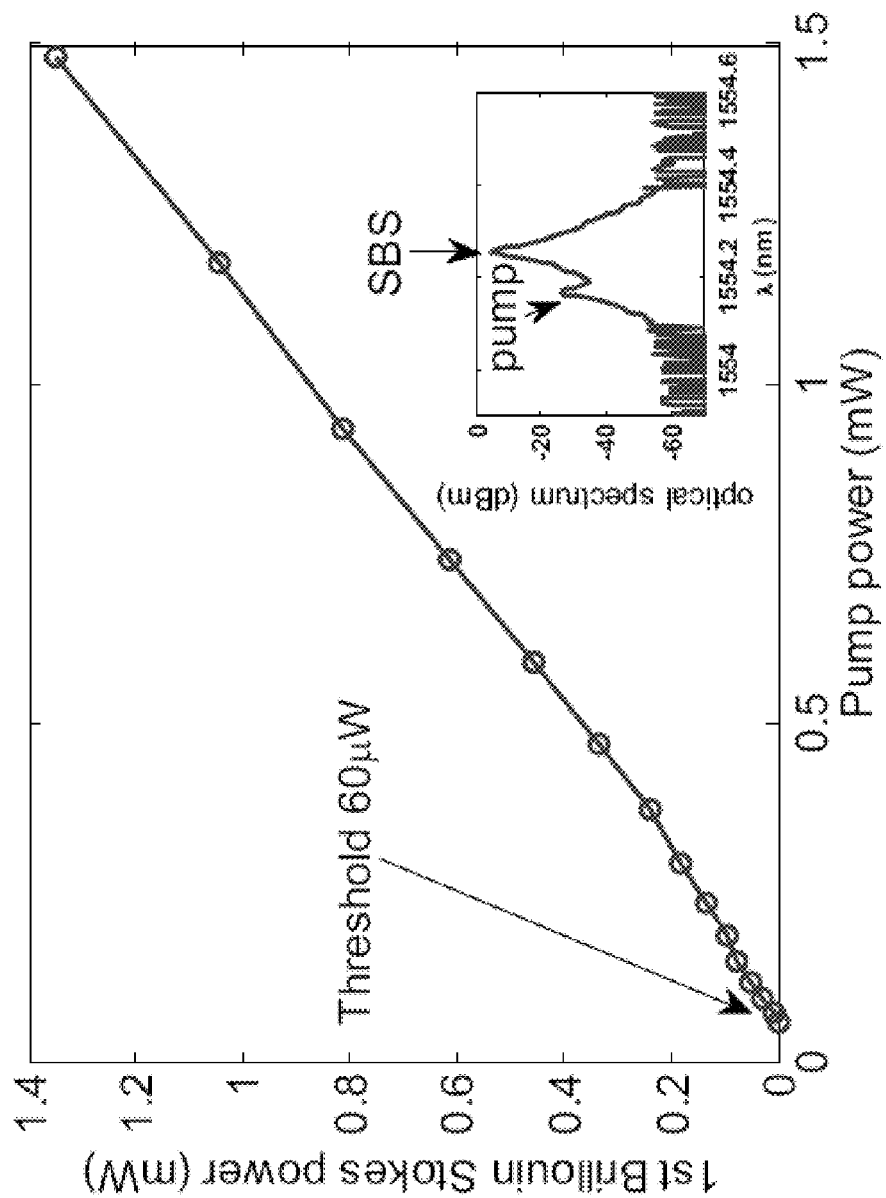
FIG. 3 shows a graph indicating output power versus coupled input power for single line operation of a laser resonator device in accordance with the invention.

FIG. 3 shows a graph indicating output power versus coupled input power for single line operation. The lower right inset to the figure is the optical spectrum showing both the Stokes line and the suppressed pump wave. In one embodiment, the threshold for the device shown is 60 µW, and the differential pumping efficiency is around 95%. Side mode suppression of the neighboring cavity modes exceeds 70 dB at around 1 mW output power (measured by observing the beat note of the main mode and weak side modes on an electrical spectrum analyzer).

The threshold for SBL action is given by the following expression:

$$P_{th} = \frac{\pi^2 n^2 V_{eff}}{g_b Q_p Q_b \lambda_p \lambda_b}$$

Beyond the importance of high cavity Q factor evident in this expression, it is very desirable to maintain a large SBL gain parameter, $g_b(\Delta\omega-\Omega_B)$ (where gain=$g_b P_{pump}$, $\Delta\omega$ is the free-spectral range, and $\Omega_B$ is the Brillouin shift). Because the gain spectrum is relatively narrow (typical full-width half maximum is 20-60 MHz [22, 29]), this requires a precise match of the free-spectral-range to the Brillouin shift. $\Omega_B$ depends on the pump wavelength $\lambda_p$ and phonon velocity $V_a$ through the relation $\Omega_B/2\pi=2nV_a/\lambda_p$.

Figure 4:
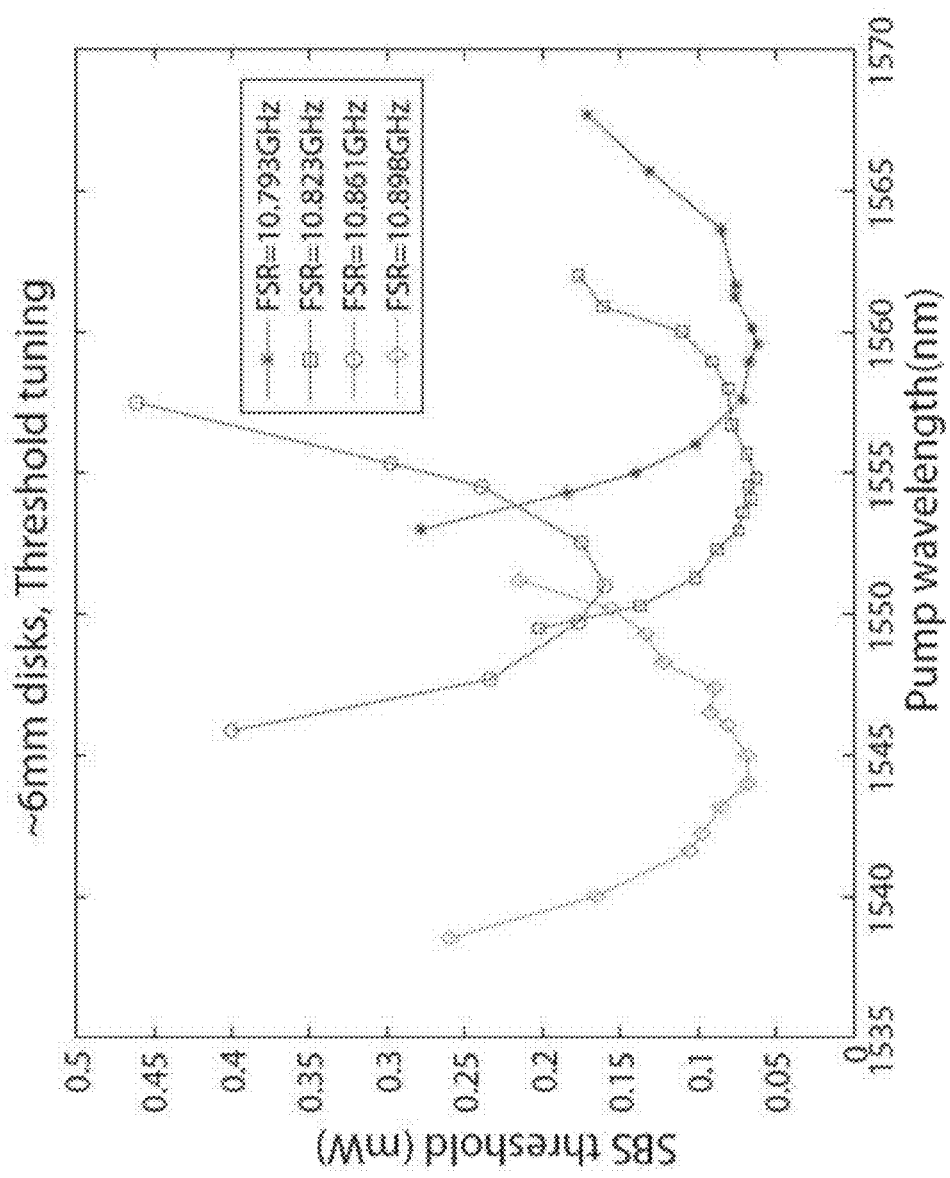
FIG. 4 shows a graph of stimulated Brillouin Laser (SBL) threshold versus pump wavelength to illustrate the threshold tuning control in four exemplary laser resonator devices.

FIG. 4 shows a graph of SBL threshold versus pump wavelength to illustrate the tuning control in four exemplary laser resonator devices having diameters of 6020, 6044, 6062 and 6080 microns (lithography mask size per FIG. 11 described below) subjected to a series of pump wavelengths in the 1500 nm band. In each device, the pump wavelength was sequentially tuned along resonances belonging to the same azimuthal mode family. The minimum simulated Brillouin scattering (SBS) threshold for each device corresponds to excitation at the Brillouin gain maximum (i.e., $g_b(\Delta\omega-\Omega_B=0)$. The rise in threshold away from the minimum (for a given resonator diameter) corresponds to excitation at the tail of the Brillouin gain spectrum and thus result in low gain parameter $g_b$ and higher threshold. This behavior reflects tuning of the Brillouin shift frequency with pump wavelength according to $\Omega_B/2\pi=2nV_a/\lambda_p$. This Figure is a further demonstration of certain the advantages in accordance with the invention: by designing and fabricating the disk size precisely so as to match the cavity free-spectral-range to the Brillouin shift frequency, it enables controllable and guaranteed stimulated Brillouin laser with minimum threshold and high efficiency.

Figure 5:
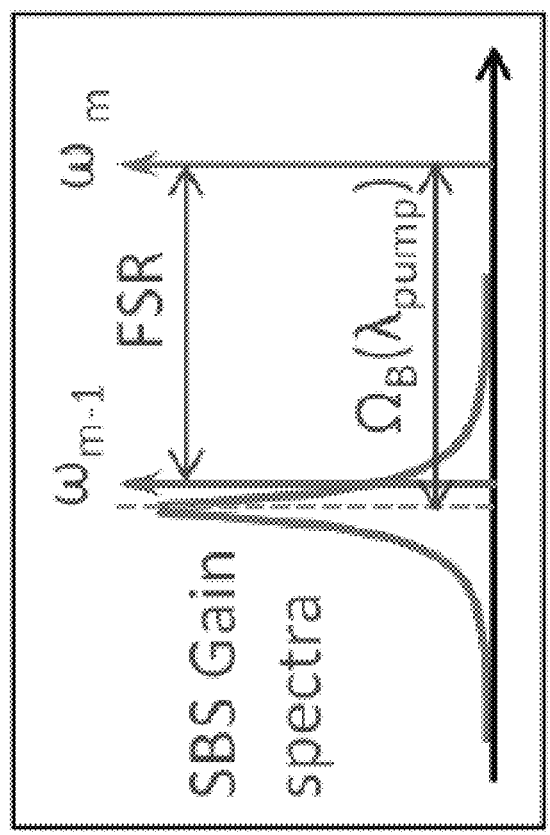
FIG. 5 shows a graph that illustrates control of stimulated Brillouin scattering (SBS) gain with change in FSR and pump wavelength in accordance with the invention.
Figure 6:
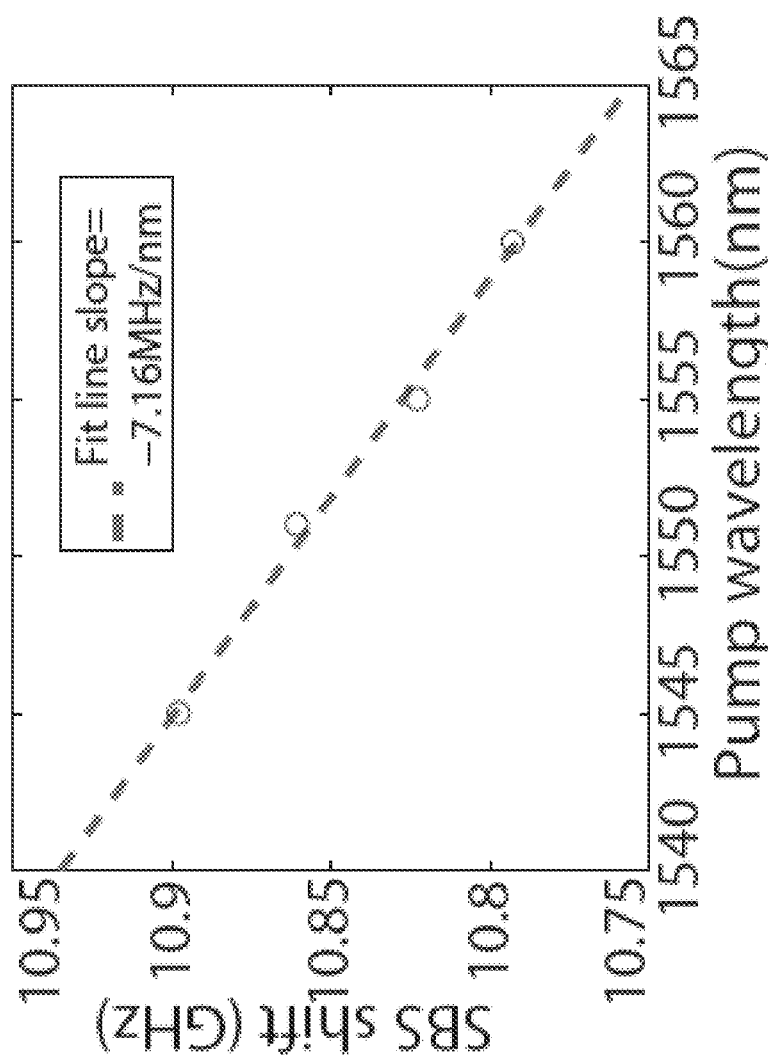
FIG. 6 shows a graph of variation of peak SBS frequency shift versus the corresponding pump wavelength in accordance with the invention.

FIG. 5 shows a graph that illustrates control of SBS gain with change in free spectral range (FSR) and pump wavelength, while FIG. 6 shows a graph of variation of peak frequency shift versus the corresponding pump wavelength.

Figure 7:
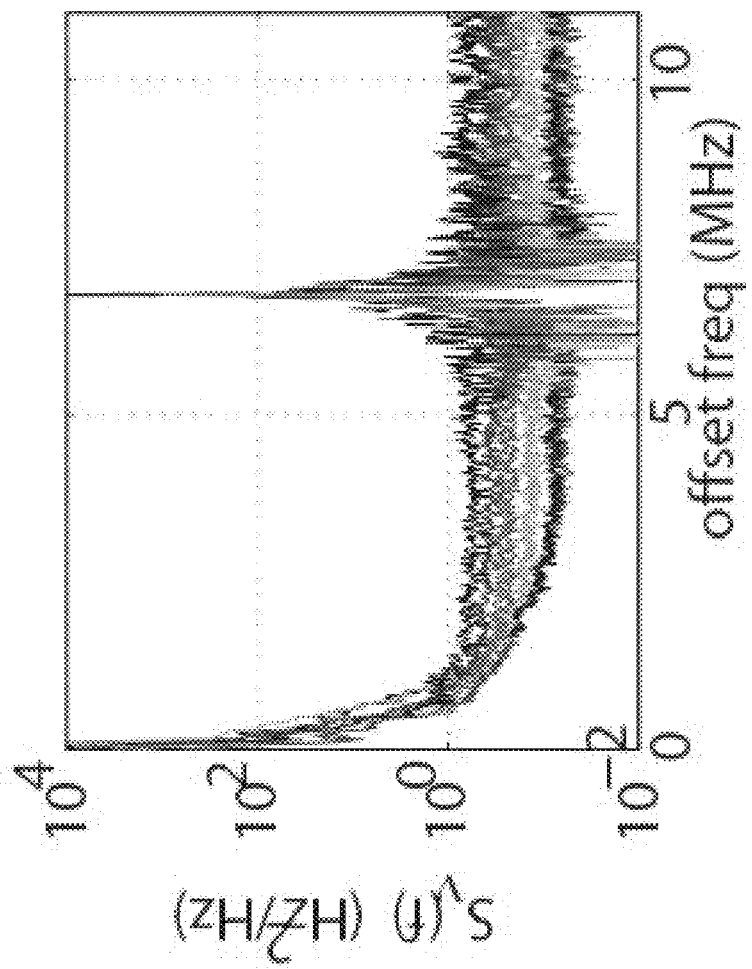
FIG. 7 shows a graph indicating stimulated Brillouin laser frequency noise spectrum at various output power levels in accordance with the invention.

FIG. 7 shows a graph indicating laser frequency noise spectrum at various output power levels in accordance with the invention. In one exemplary implementation, a Mach-Zehnder interferometer (not shown) having a free spectral range of 6.72 MHz is used as a discriminator and the optical power of the generated coherent laser is detected and measured using an electrical spectrum analyzer (ESA). To suppress the intensity noise, the complementary outputs of the interferometer were detected using a balanced receiver. This ESA spectrum is related to the frequency-fluctuation spectral density, $S_\upsilon(f)$ through the following relation:

$$W_{ESA}(f) = \frac{V_{pp}^2 2\pi^2 \tau_d^2 \text{sinc}^2(\tau_d f) S_\nu(f)}{R_L}$$

where $\tau_d$ is the Mach-Zehnder delay and Vpp is the peak-to-peak voltage of the detected MZI output over one fringe. This formula is used to plot the frequency-fluctuation spectral density in FIG. 7. The singularity in the plots at 6.72 MHz is an artifact of the data conversion near the zero of the sinc$^2$ function. The frequency-fluctuation spectra have a relatively flat (white noise) region for carrier offset frequencies above 2 MHz and then a 1/f-like region at frequencies below 2 MHz.

Figure 8:
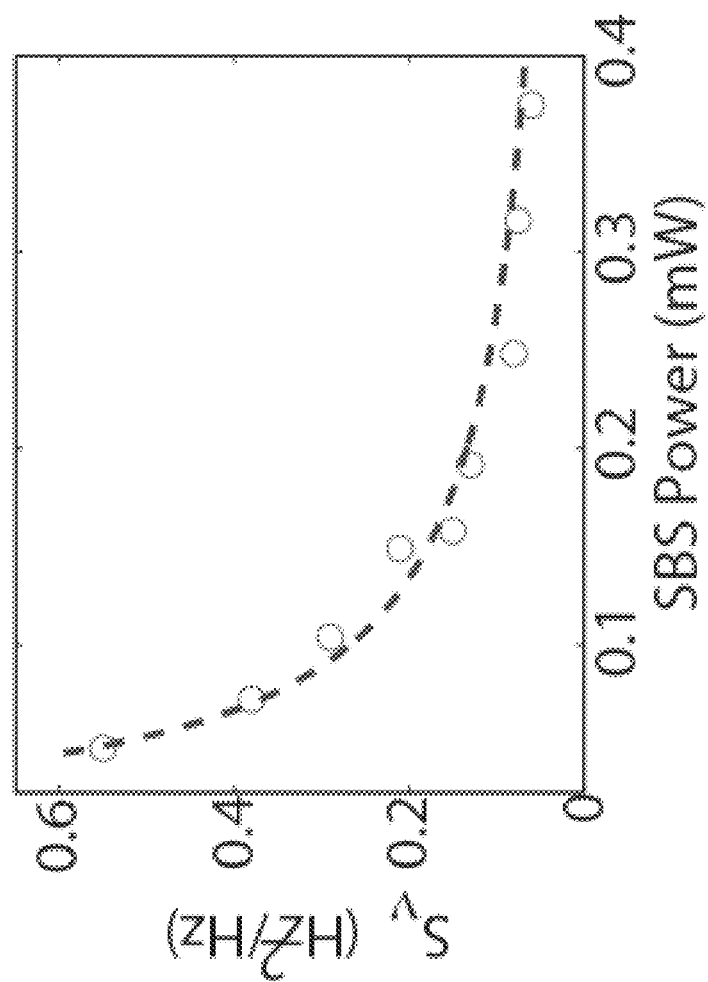
FIG. 8 shows a plot of Schawlow-Townes noise versus simulated Brillouin scattering (SBS) power.
Figure 9:
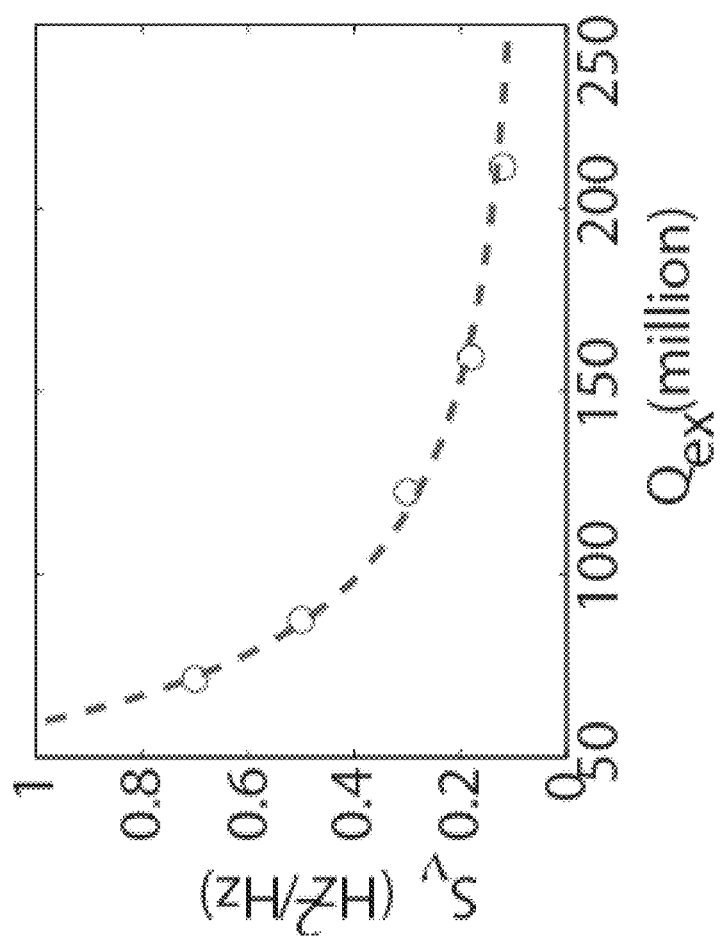
FIG. 9 shows a plot of Schawlow-Townes noise versus external cavity quality factor.

FIG. 8 shows a plot of Schawlow-Townes noise versus simulated Brillouin scattering (SBS) power and the inverse-power fit curve according to theory (dash line). FIG. 9 shows a plot of Schawlow-Townes noise versus external cavity quality factor $Q_{ex}$ and the fit curve with inverse Q squared (dashed curve). These plots, where the experimental data and theoretical fits agree well, indicate that the measured frequency noise component in this exemplary implementation is the ST quantum noise of the laser resonator device in accordance with the invention. It may be pertinent to point out that measuring and documenting the effect of cavity quality factor (Q) on Schawlow-Townes noise is feasible as a result of having an ability to vary the taper loading of simulated Brillouin laser (SBL) disk resonator 12 in accordance with the invention.

Figure 10:
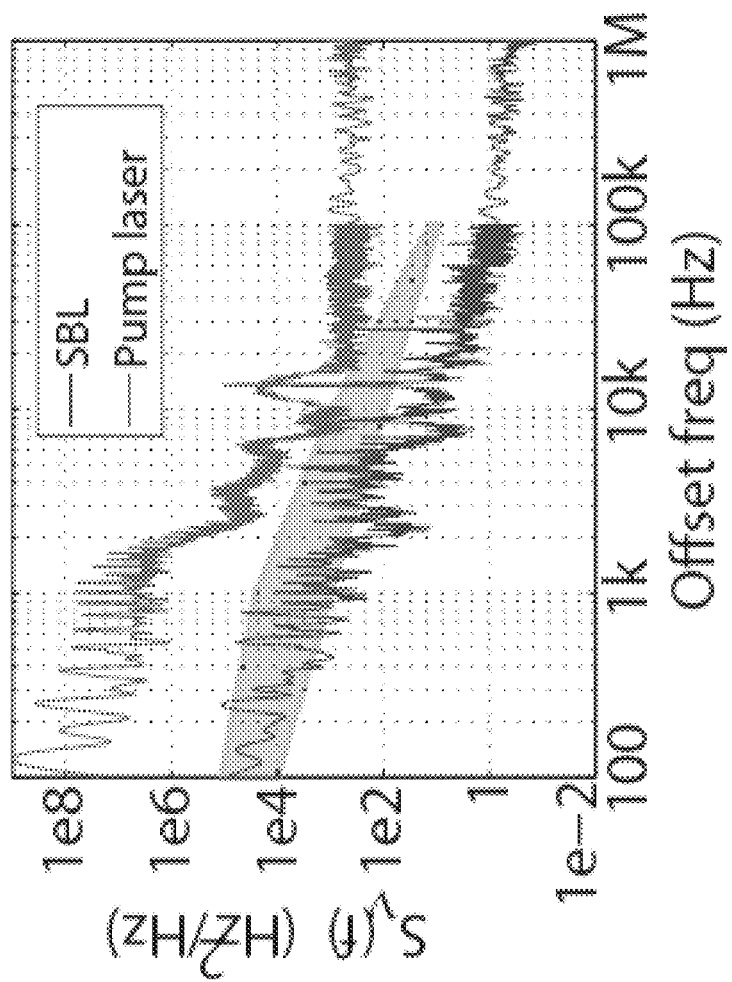
FIG. 10 shows a comparison between a typical SBL frequency noise spectrum obtained in accordance with the invention, and the frequency noise spectrum of a pump laser (low-coherence external cavity diode laser) at offset frequencies from 100 Hz to 1 MHz.

FIG. 10 shows a comparison between a typical SBL frequency noise spectrum obtained in accordance with the invention, and the frequency noise spectrum of a pump laser (low-coherence external cavity diode laser) at offset frequencies from 100 Hz to 1 MHz. The shaded region is the frequency noise performance of commercial, narrow linewidth fiber lasers.

The 1/f noise that appears at lower carrier offset frequencies is indicated in FIG. 10 and approximately tracks a similar-shaped noise spectrum in the laser pump over this frequency range. However, the absolute level of 1/f noise of the SBL at a given offset frequency is reduced by about 30 dB relative to the 1/f noise in the pump. The level of technical noise in this band is comparable to several prior art fiber lasers. The ability to obtain frequency noise levels comparable to fiber lasers, but for on-chip operation opens new possibilities for miniaturization and integration in coherent communication, high-stability microwave oscillators, and potentially in remote sensing. In each of these cases, the SBL device in accordance with the invention, provides a new role as a spectral purifier, boosting the coherence of the pump wave (initiated via pump light provided by tunable CW laser 205, for example) by several orders of magnitude. The relatively small frequency shift created in this process (about 11 GHz) may be readily compensated by controlling tunable CW laser 205, for example, in the pump.

In certain implementations, low coherence DFB lasers may be manufactured with the wavelengths set on the ITU grid by control of an integrated grating pitch. Final control may then be provided by temperature tuning of the fully packaged device. A DFB laser could be tuned through this same process to function as an SBL pump so that the emitted SBL wavelength resides at the desired ITU channel. In this way, the existing WDM infrastructure could be adapted for high coherence operation in optical QAM systems. The frequency noise levels demonstrated here exceed even state of the art monolithic semiconductor laser by 40 dB. Using the measured phase noise, it is estimated that Square 1024-QAM formats could be implemented using an SBL generated optical carrier at 40 GB/s.

Attention is now drawn to FIG. 11, which shows a few stages of manufacture of a disk resonator which is one exemplary embodiment of a laser resonator device in accordance with the invention. The disk resonator may be alternatively referred to herein (mainly with reference to FIGS. 11-14) as a circular wedge resonator, a disk resonator, or a wedge resonator 150 because of the presence of a wedge in the resonator, wherein the wedge may be used as a waveguide for propagating light and generating resonance in the laser resonator device.

The manufacture flow (indicated by arrow 160) begins with a silicon substrate 105. Though the description below may suggest fabrication of a single device from silicon substrate 105, it will be understood that multiple devices may be fabricated from a single silicon substrate 105. This form of batch manufacturing of devices is known in the art and will not be elaborated upon herein in the interests of avoiding distraction from the main aspects of the manufacture in accordance with the invention. It will be also understood that producing multiple devices from a single substrate 105 provides several advantages. Specifically, in accordance with the invention, the fabricating of a batch of devices is carried out with sub-micron control of a diameter dimension to obtain a substantial similar Q factor in each disk resonator. For example, various steps such as creating a mask by applying a photo-resist layer upon a silicon dioxide layer and the subsequent step of etching allow sub-micron control of the diameter dimension, thereby eliminating or minimizing the prior art process of relying on statistical procedures involving variation in size and shape to create accidental matches among resonator devices manufactured in larger volumes.

By proper control of both the wet and dry etching processes described below, the Q of the resulting resonator can be nearly 1 billion. Moreover, the lithography and etching process provides precise control over the cavity size, and more specifically allows fabrication of specific cavity sizes with sub-micro precision. Such precisely manufactured cavities are advantageous for executing SBS lasering operations. The cavity size control may be defined in terms of a diameter control, which is quantified by a ratio between an "uncertainty" of cavity size to a diameter of the cavity. A diameter control of 1:20,000 is deemed adequate to place the microcavity FSR within the Brillouin frequency shift for generating a laser in accordance with the invention.

Turning back to the manufacture flow shown in FIG. 11, silicon substrate 105, which for example, is a 100 prime grade float zone silicon wafer, is placed in a furnace that is raised to a suitable temperature at which a top layer of the silicon substrate 105 turns into a silicon dioxide layer 110. The thickness to which silicon dioxide layer 110 is formed may vary from one implementation to another. In one exemplary implementation, silicon dioxide layer 100 may range from about 8 micron thickness to about 10 micron thickness Significantly, during this heating process, steam is introduced into the furnace. In other words, silicon substrate 105 is subjected to heat in a humid atmosphere for forming silicon dioxide layer 110. While the water constituent is desirable at this stage of manufacture, it is desirable that any residual moisture in the product be eliminated subsequently.

Consequently, the water content is purged by placing assembly 100 in a furnace operating at 1000 degrees Celsius for approximately a 24 hour period. This drying out process contributes to a significant level of reliability in obtaining a desirably high Q factor in the manufactured product.

In manufacture stage 1, an assembly 120 is formed by applying a photo-resist layer 115 upon silicon dioxide layer 110 in the form of a suitable pattern. Various patterns may be used, including patterns used for fabricating a batch of resonator devices. Specifically, in one exemplary embodiment, a circular pattern is used to obtain a waveguide such as the disk resonator in accordance with the invention. The application of photo-resist layer 115 may be carried out in different ways. For example, photo-resist layer 115 may be patterned using a stepper on thermally grown silicon dioxide layer 115 having a thickness in the range of 2-10 microns.

In manufacture stage 2, assembly 120 is immersed in a suitable etchant, such as, for example, a buffered hydrofluoric acid solution. After immersion for a certain period of time, the etchant acts upon silicon dioxide layer 110 to not only expose a portion of the top surface of silicon substrate 105, but also to form a wedge structure 135 below photo-resist layer 115. In contrast to the exposed top surface of silicon substrate 105, which is relatively smooth, the sloping surface of the wedge structure 135 has a certain roughness as well as a deformity in the form of what is referred to herein as a "foot region" 130.

The surface roughness of wedge structure 135, as well as the presence of foot region 130, is undesirable because both these features create a negative impact on light propagated inside the wedge structure 135, more specifically on the Q factor of the finished product. As is known, the Q factor defines a photon storage time in a waveguide structure, with a higher Q indicating a larger storage time.

Consequently, manufacturing stage 2 is followed by manufacturing stage 3, wherein the period of time selected for manufacturing stage 2 is specifically extended in order to obtain a higher Q by eliminating foot region 130 and producing a smooth, linear surface having a desirable slope angle 125 in the wedge structure 135.

The desirable slope angle 125 ranges from about 7 degrees to about 90 degrees. Prior art solutions have expressly aimed at manufacturing and using angles below 27 degrees. However, such small angles do not provide satisfactory performance in terms of obtaining high Q values, and furthermore suffer from certain handicaps during manufacture as well as in product structure. One of the handicaps associated with prior art manufacturing is the need to include a reflow process in order to obtain high Q in a lossy foot wedge region. As for product structure, one of the handicaps pertains to a relatively large spacing requirement between two adjacent elements such as between a pair of waveguide channels. This spacing aspect may be better understood from additional description below.

Slope angle 125 may be empirically controlled in various ways. In one implementation, slope angle 125, as well as the surface roughness of the wedge structure 135, is controlled by selecting an appropriate adhesion factor incorporated into photoresist layer 115. The adhesion factor incorporated into photoresist layer 115 may be varied by using various types of adhesion promoters. In other words, for a given period of time, to obtain a larger slope angle, a promoter that provides higher adhesion may be used because such a promoter prevents fast penetration between the photoresist layer 115 and silicon dioxide layer 110.

In manufacture stage 4, photo-resist layer 115 is removed by employing a cleaning process, after which assembly 145 is exposed to a xenon difluoride ($XeF_2$) environment that etches a portion of silicon substrate 105 and forms a support pillar that supports wedge structure 135. The removal of the portion of silicon substrate 105 results in an undercut below wedge structure 135, the undercut serving to isolate light 111 propagating inside wedge structure 135 from coupling into silicon substrate 105. The undercut may be set to various values. For example, in one embodiment, the undercut is set to about 100 microns for a 1 mm diameter wedge structure, and in another embodiment, the undercut is set to over 150 microns for a 7.5 mm diameter wedge structure.

A disk resonator fabricated upon a chip, and having a Q factor of about 875 million may be manufactured via the method of manufacture described above, wherein a disadvantageous prior art reflow step has been eliminated. This Q factor is achievable in an important size range of diameters greater than 500 microns, and may be used for realizing microwave rate FSR. A disk resonator fabricated using this method of manufacture not only provides a new benchmark for Q factor on a chip, but also provides precise control of micro cavity size. This precise control of micro cavity size permits placing of the micro cavity FSR within the Brillouin frequency shift for generating a laser in accordance with the invention.

Furthermore, it will be understood that while the method described above described the creation of a silicon dioxide layer upon a silicon substrate, the method may be similarly applied using substrates other than silicon.

Figure 12:
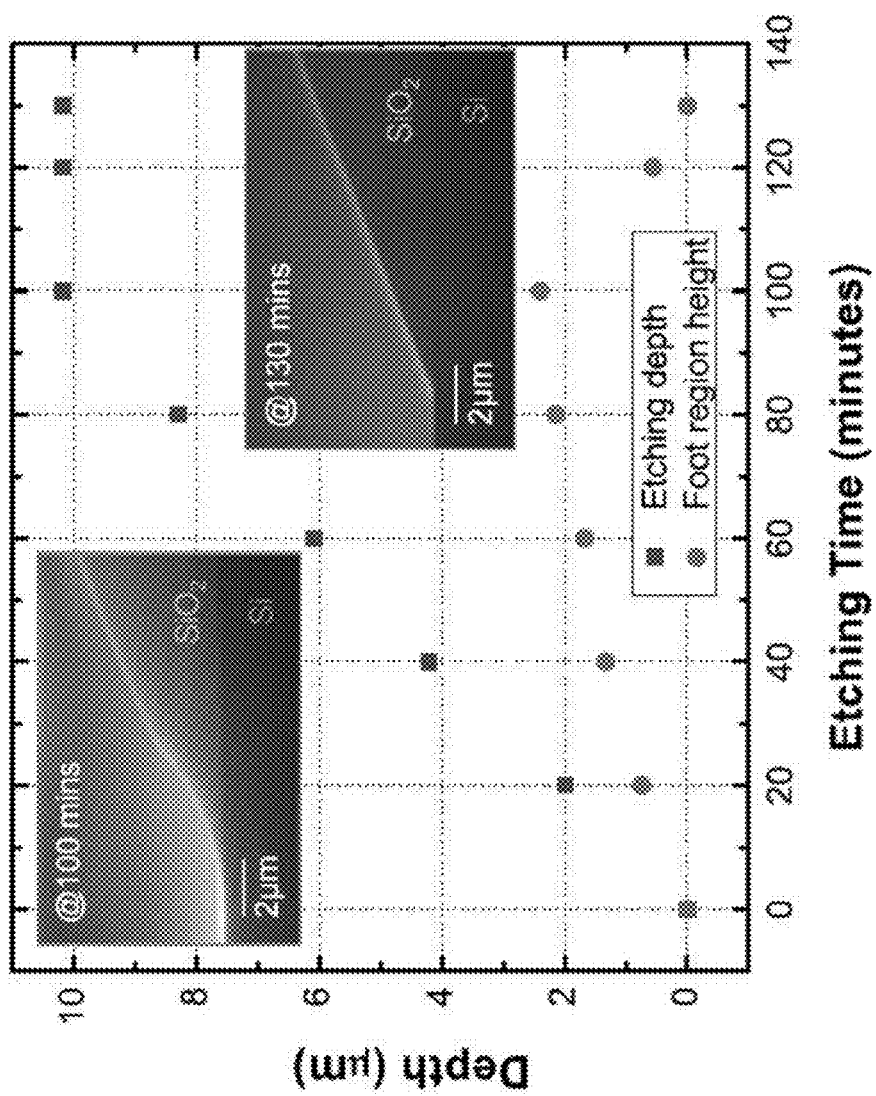
FIG. 12 shows a graph that shows the effect of etching time when a 10 um thick silicon assembly is etched in accordance with the manufacture flow shown in FIG. 11.

FIG. 12 shows a graph indicating the effect of etching time on appearance of the foot region during etching. In this particular example, the silica layer has a thickness of about 10 micron. As can be understood, extending the etching time from 100 minutes (where the foot region is present) to 130 minutes eliminates the foot region and produces a smooth (linear) sloping surface.

Figure 13:
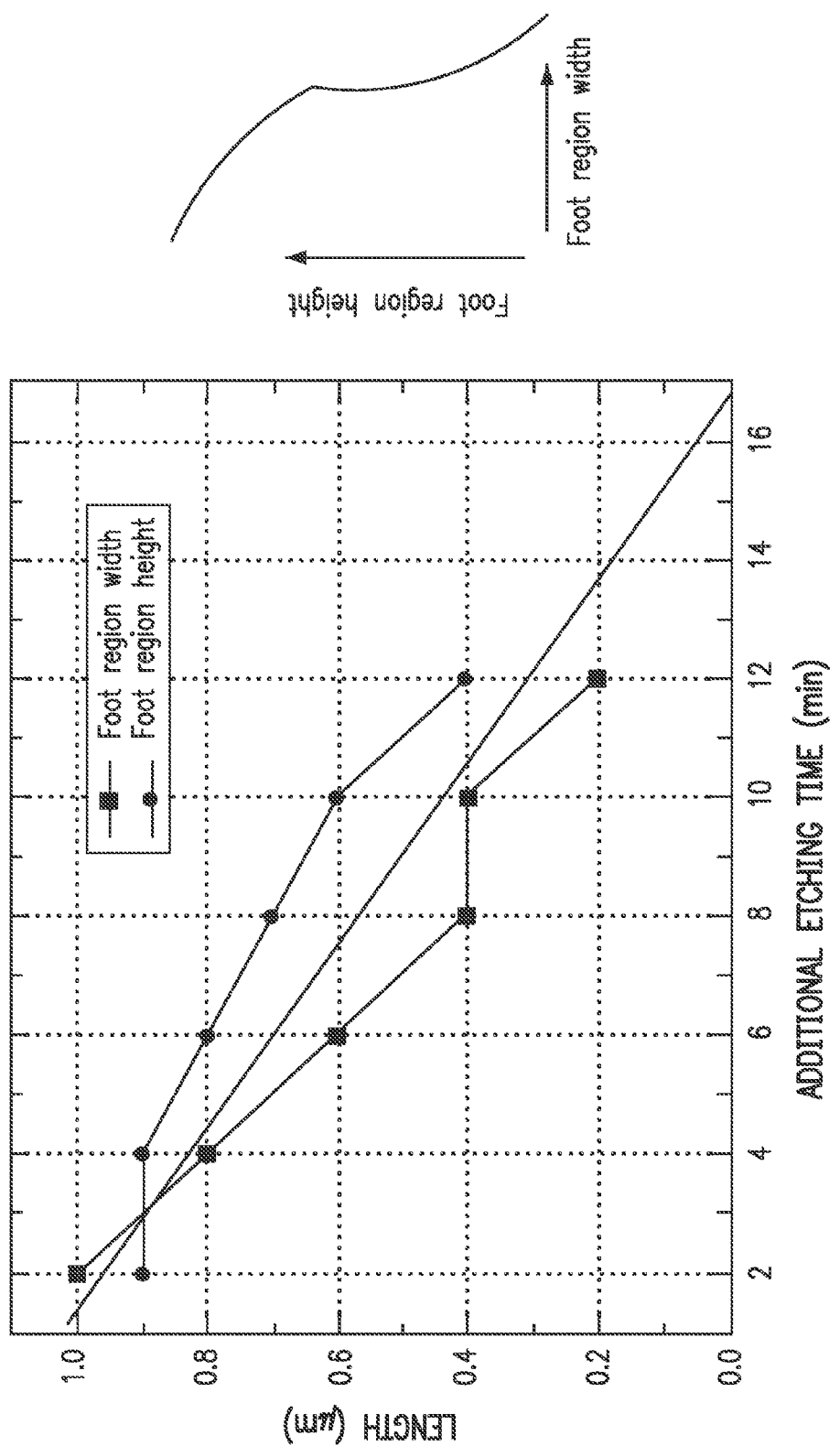
FIG. 13 shows a graph that provides some information pertaining to an additional etching time that is used to eliminate a foot region when a 2 um thick silicon assembly is etched in accordance with the manufacture flow shown in FIG. 11.

FIG. 13 shows a graph that provides some additional information pertaining to the extended etching time. As can be observed from the graph, the extended etching time may be varied in part, based on the height and/or the width of the foot region, with a greater period of time being used to etch excess material when the foot width and/or height is larger.

Figure 14:
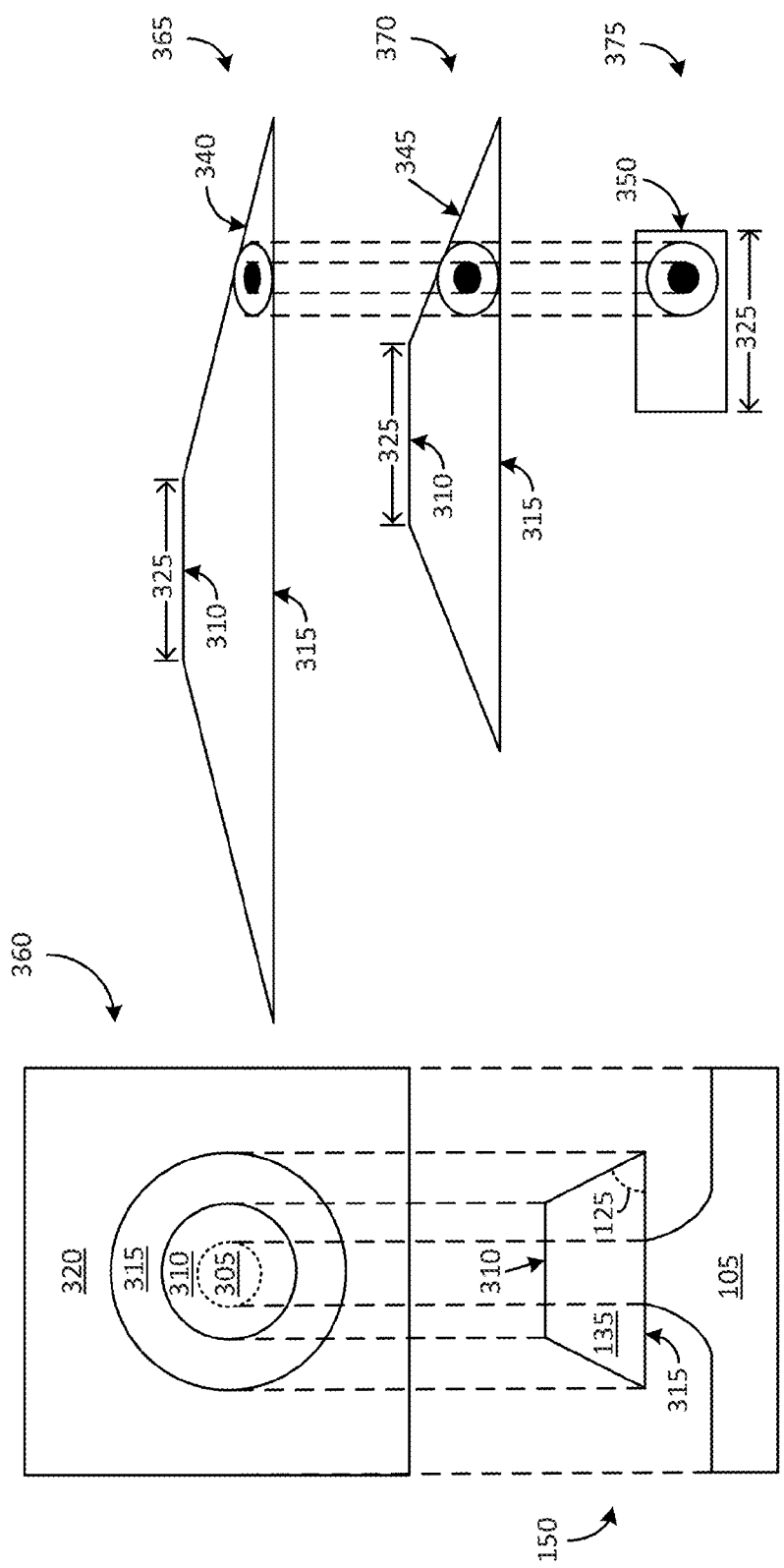
FIG. 14 shows several cross-sectional views of associated with a circular wedge resonator to illustrate the effects of slope angles on light propagation through a waveguide portion of the disk resonator.

FIG. 14 shows several cross-sectional views associated with a circular wedge resonator 150 (disk resonator) to illustrate the effects of slope angles on light propagation through a waveguide portion of the resonator. View 360 provides a top view of circular wedge resonator 150. In this top view, area 305 corresponds to the support pillar seen through the silicon dioxide wedge structure 135, which is transparent as a result of the silicon dioxide material (which is basically, glass). The area 310 corresponds to the top surface of wedge structure 135, area 315 to the bottom surface of wedge structure 135 and area 320 corresponds to the silicon substrate 105. The concentric, non-overlapping area between circular areas 310 and 315 corresponds to the sloping surface of circular wedge resonator 150. While various portions of the wedge structure may be used to define the dimensions of the wedge resonator, in one embodiment, the diameter of area 315 is used to distinguish one resonator over another (for example, 0.5 mm and 25 mm disk resonators as referred to herein).

Various configurations of this sloping surface will now be described in order to highlight the effects of slope angle 125 (in wedge resonator 150) upon photonic propagation through wedge structure 135 of circular wedge resonator 150.

When slope angle 125 is relatively acute (less than 27 degrees, typically around 7 degrees) as shown in embodiment 365, a distorted mode profile 340 is created during a fundamental TE mode of photonic propagation.

When slope angle 125 is greater, not only does mode profile 340 suffer less mode compression, but the widths of surfaces 310 and 315 may be made smaller in width than those of embodiment 365.

When slope angle 125 approaches 90 degrees, mode profile 340 suffers reduced mode compression and the widths of surfaces 310 and 315 become more optimally minimal. Consequently, in certain embodiments in accordance with the invention it is preferable to incorporate slope angles ranging from about 60 degrees to about 90 degrees. However, in certain other embodiments, it may be preferable for various other reasons, to incorporate slope angles down to around 7 degrees.

The description above that is made with reference to various figures illustrates certain aspects of the invention. Additional description provided below provides further insights into certain benefits and features.

Prior art approaches have taken into consideration the Q factor in a wedge-shaped resonator device fabricated of silica on a silicon wafer [6]. Q factors as high as 50 million were obtained in these prior art approaches, which primarily focused on reducing optical loss by isolating the propagation mode from the lithographic blemishes near the outer rim of the resonator by using a shallow wedge angle. In contrast to the Q values obtained in the prior art solutions, the approach described herein results in an optical Q that is boosted by a factor of 15× beyond the earlier achieved values. An exemplary Q factor of 875 million has been achieved using various embodiments described herein. This Q factor corresponds to an equivalent waveguide loss of 0.03 dB/m.

While the devices in accordance with the invention may resemble the earlier geometry to some extent, these new devices derive ultra-high Q performance from overall changes to the etch process and the oxide growth. Specifically, the physical principle at work in the earlier structures, a shallow wedge angle to provide roughness isolation, is no longer required. Indeed, and in contrast to earlier work, larger wedge angles are desirable. For example, these larger wedge angles can range from 27 degrees to 90 degrees as described herein.

The ability to lithographically define ultra-high Q resonators as opposed to relying upon the reflow process enables a multi-order-of-magnitude improvement in control of resonator diameter and free-spectral-range (FSR).

All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content, clearly dictates otherwise. Unless defined otherwise, all technical and scientific terms used herein have the same meaning as commonly understood by one of ordinary skill in the art to which the disclosure pertains.

The examples set forth above are provided to give those of ordinary skill in the art a complete disclosure and description of how to make and use the embodiments of the waveguides of the disclosure, and are not intended to limit the scope of what the inventors regard as their disclosure. Modifications of the above-described modes for carrying out the disclosure may be used by persons of skill in the video art, and are intended to be within the scope of the following claims.

A number of embodiments of the disclosure have been described. Nevertheless, it will be understood that various modifications may be made without departing from the spirit and scope of the present disclosure. Accordingly, other embodiments are within the scope of the following claims.

LIST OF REFERENCES

[1] Fortier, T., Kirchner, M., Quinlan, F., Taylor, J., Bergquist, J., Rosenband, T., Lemke, N., Ludlow, A., Jiang, Y., Oates, C. & Diddams, S., Generation of ultra-stable microwaves via optical frequency division, *Nature Photon.* 5, 425-429 (2011)

[2] IP, E., Lau, A., Barros, D. & Kahn, J., Coherent detection in optical fiber systems, *Opt. Exp.* 16, 753-791 (2008)

[3] Karlsson, C., Olsson, F., Letalick, D., & Harris, M., All-fiber multifunction CW coherent laser radar at 1.55 μm for range, speed, vibration, and wind measurements, *App. Opt.* 39, 3716-3726 (2000)

[4] Rafac, R., Young, B., Beall, J., Itano, W., Wineland, D. & Berquist, J., Sub-dekahertz Ultraviolet Spectroscopy of $^{199}$Hg$^+$, *Phys. Rev. Lett.* 85, 2462-2465 (2000).

[5] Young, B., Cruz, F., Itano, W. & Bergquist, J., Visible Lasers with Subhertz Linewidths, *Phys. Rev. Lett.* 82, 3799-3802 (1999).

[6] Kasai, K. et al, 256-QAM (64 Gb/s) Coherent Optical Transmission Over 160 km With an Optical Bandwidth of 5.4 GHz, *IEEE Photon. Technol. Lett.* 22, 185-187 (2010)

[7] Del'Haye, P., Schliesser, A., Arcizet, O., Wilken, T., Holzwarth, R. & Kippenberg, T., Optical frequency comb generation from a monolithic microresonator, *Nature* 450, 1214-1217 (2007)

[8] Kippenberg, T. J., Holzwarth, R. & Diddams, S. A., Microresonator-Based Optical Frequency Combs, *Science* 332 555-559 (2011)

[9] Lee, H., Chen, T., Li, J., Painter, O. & Vahala. K., Ultra-high-Q wedge-resonator on a silicon chip, *Frontiers in Optics Meeting*, Paper #FWS2 (2011)

[10] Lee, H., Chen, T., Li, J., Yang, K., Jeon, S., Painter, O. & Vahala. K., Ultra-high-Q wedge-resonator on a silicon chip, arXiv:1112.2196v1 (2011)

[11] Schawlow, A., & Townes, C. H., Infrared and Optical Masers, *Phys. Rev.* 112, 1940-1949 (1958)

[12] Vahala, K. J. & Yariv, A., Semiclassical theory of noise in semiconductor lasers—Part I, *IEEE J. Quan. Elec.* 19, 1096-1101 (1983)

[13] Agrawal, G. P., Mode-partition noise and intensity correlation in a two-mode semiconductor laser, *Phys. Rev. A* 37, 2488-2494 (1988)

[14] Okai, M., Suzuki, M. & Taniwatari, T., Strained multi-quantum-well corrugation-pitch-modulated distributed feedback laser with ultranarrow (3.6 kHz) spectral linewidth, *Electron. Lett.* 29, 1696-1697 (1993);

[15] Tomes, M. & Carmon, T., Photonic Micro-Electromechanical Systems Vibrating at X-band (11-GHz) Rates, *Phys. Rev. Lett.* 102, 113601 (2009).

[16] Grudinin, I., Matsko, A., & Maleki, L., Brillouin Lasing with a $CaF_2$ Whispering Gallery Mode Resonator, *Phys. Rev. Lett.* 102, 043902 (2009).

[17] Spillane, S., Kippenberg, T., Vahala, K. J., Ultralow-threshold Raman laser using a spherical dielectric microcavity, *Nature* 415 621-623 (2002)

[18] Cai, M., Painter, O., & Vahala, K. J., Observation of critical coupling in a fiber taper to silica-microsphere whispering gallery mode system, *Phys. Rev. Lett.* 85, 74-77 (2000)

[19] Spillane, S., Kippenberg, T., Painter, O. & Vahala, K. J., Ideality in a Fiber-Taper-Coupled Microresonator System for Application to Cavity Quantum Electrodynamics, *Phys. Rev. Lett.* 91, 043902 (2003)

[20] Yang, L., Lu, T., Carmon, T., Min, B. & Vahala, K. J., A 4-Hz Fundamental Linewidth On-Chip Microlaser, *CLEO* (2007)

[21] Lu, T., Yang, L., Carmon, T., Min, B. & Vahala, K. J., Frequency Noise of a Microchip Raman Laser, *CLEO* (2009)

[22] Smith, S. P., Zarinetchi, F. & Ezekiel, S., Narrow-linewidth stimulated Brillouin fiber laser and applications, *Opt. Lett.* 16 393-395 (1991)

[23] Okawachi, Y., Bigelow, M., Sharping, J., Zhu., Z., Schweinsberg, A., Gauthier, D., Boyd, R. & Gaeta, A., Tunable all-optical delays via Brillouin slow light in an optical fiber, *Phys. Rev. Lett.* 94, 153902 (2005)

[24] Zhu, Z., Dawes, A., Gauthier, D., Zhang, L. & Willner, A., Broadband SBS slow light in an optical fiber, *Journal of Lightwave Technol.* 25, 201-206 (2007)

[25] Zhu, Z., Gauthier, D. & Boyd, R., Stored light in an optical fiber via stimulated Brillouin scattering, *Science* 318, 1748-1750 (2007)

[26] Armani D. K., Kippenberg T. J., Spillane, S. M & Vahala, K. J., Ultra-high-Q toroid microcavity on a chip, *Nature* 421, 925-928 (2003)

[27] Hansch, T. W. & Couillaud, B., Laser frequency stabilization by polarization spectroscopy of a reflecting reference cavity. *Opt. Commun.* 35, 441-444 (1980).

[28] Schliesser, A., Riviere, R., Anetsberger, G., Arcizet, O. & Kippenberg. T. J., Resolved-sideband cooling of a micromechanical oscillator, *Nature Phys.* 4, 415-419 (2008)

[29] Tkach, R. W., Chraplyvy, A. R. & Derosier, R. M., Spontaneous Brillouin scattering for single-mode optical-fibre characterisation, *Electron. Lett.* 22 1011-1013 (1986)

[30] C. Karlson, F. Olsson, D. Letalick, and M. Harris, "All-fiber multifunction CW coherent laser radar at 1.55 um for range, speed, vibration, and wind measurements," Appl. Opt. 39, 3716-3726 (2000)

[31] J. Geng, C. Spiegelberg, and S. Jiang, "Narrow Linewidth Fiber Laser for 100-km Optical Frequency Domain Reflectometry," IEEE Photon. Technol. Lett. 17, 1827-1929 (2005)

[32] S. Savory and A. Hadjifotiou, "Laser Linewidth Requirements for Optical DQPSK Systems," IEEE Photon. Technol. Lett. 16, 930-932(2004)

What is claimed is:

1. A laser source comprising:
(a) a pump laser source and an optical fiber arranged to launch pump laser power to propagate along the optical fiber past a tapered segment thereof; and
(b) a semiconductor oxide disk optical resonator positioned on a semiconductor substrate so as to enable optical coupling of at least a portion of the pump laser power from the optical fiber into the disk optical resonator, wherein:
(c) the disk optical resonator rests on a circumscribed, flat-topped protrusion from a surface of the substrate;
(d) the pump laser source and the disk optical resonator are arranged so that a selected optical frequency of the pump laser power substantially coincides with an optical frequency of a resonant optical mode of the disk optical resonator;
(e) the disk optical resonator is arranged with a substantially frusto-conical outer circumferential surface, characterized by a slope angle greater than about 27°, so as to exhibit a Q-factor greater than about $10^7$ at the pump laser optical frequency; and
(f) the disk optical resonator is arranged so as to exhibit a free spectral range that substantially coincides with an optical frequency of a stimulated Brillouin gain spectrum of the semiconductor oxide disk optical resonator, so that the portion of the pump laser power coupled into the disk optical resonator, with the pump laser power above a pump laser power threshold level, results in stimulated Brillouin laser oscillation in the disk optical resonator.

2. The laser source of claim 1 wherein the semiconductor substrate comprises silicon and the semiconductor oxide disk optical resonator comprises silicon dioxide.

3. The laser source of claim 2 wherein the free spectral range of the disk optical resonator is 10.8 GHz±0.5 MHz so as to substantially coincide with the stimulated Brillouin gain spectrum of the disk optical resonator comprising silicon dioxide.

4. The laser source of claim 1 further comprising a photodetector arranged so as to provide an error signal for locking the optical frequency of the pump laser power to the optical frequency of the resonant optical mode of the disk optical resonator.

5. The laser course of claim 1 wherein the pump laser power threshold level is about 60 µW.

6. The laser source of claim 1 wherein the disk optical resonator is arranged so as to exhibit a laser output noise level of about 0.06 $Hz^2$/Hz at a stimulated Brillouin laser output power of about 400 µW.

7. The laser source of claim 1 wherein the pump laser source and the disk optical resonator are arranged so that a laser output noise level of the stimulated Brillouin laser oscillation exhibited by the disk optical resonator is about 30 dB lower than a pump laser power noise level exhibited by the pump laser source.

8. The laser source of claim 1 wherein the disk optical resonator is between about 8 µm thick and about 10 µm thick.

9. The laser source of claim 1 wherein the disk optical resonator comprises a remnant of a wet-etched layer of semiconductor oxide material grown on the substrate surface, and the flat-topped protrusion comprises a remnant of a dry-etched surface of the substrate.

10. The laser source of claim 1 wherein the pump laser source, the optical fiber, and the disk optical resonator are arranged so that the stimulated Brillouin laser oscillation exhibits an overall efficiency of at least 90% or a differential efficiency of at least 95%.

11. An article comprising:
(a) a substantially flat semiconductor wafer having on one surface thereof a set of multiple, circumscribed, flat-topped protrusions of semiconductor wafer material; and
(b) a set of multiple disk optical resonators, wherein each disk optical resonator of the set is positioned on a corresponding one of the flat-topped protrusions of the semiconductor wafer and comprises a semiconductor oxide material, wherein:
(c) each disk optical resonator of the set includes a frusto-conical outer circumferential surface characterized by a slope angle greater than about 27° so as to exhibit a Q-factor greater than about $10^7$ at a selected pump laser optical frequency; and
(d) the mean diameter of the set of disk optical resonators, and variation of diameter among the disk optical resonators of the set, result in a free spectral range exhibited by each disk optical resonator that substantially coincides with a Brillouin shift frequency of the semiconductor oxide material.

12. The article of claim 11 wherein the semiconductor wafer material comprises silicon and the semiconductor oxide material comprises silicon dioxide.

13. The article of claim 12 wherein the free spectral range of each disk optical resonator of the set is 10.8 GHz±0.5 MHz so as to substantially coincide with the stimulated Brillouin gain spectrum of the disk optical resonator comprising silicon dioxide.

14. The article of claim 11 wherein each disk optical resonator of the set is characterized by a diameter that deviates from a mean diameter of the set of disk optical resonators by less than 1 part in 20,000.

15. The article of claim 11 wherein each disk optical resonator of the set is between about 8 µm thick and about 10 µm thick.

16. The article of claim 11 wherein each disk optical resonator of the set comprises a remnant of a wet-etched layer of semiconductor oxide material grown on the wafer surface, and each flat-topped protrusion of the set comprises a remnant of a dry-etched surface of the wafer.

\* \* \* \* \*